US006538453B1

(12) United States Patent
Orchard, II et al.

(10) Patent No.: US 6,538,453 B1
(45) Date of Patent: Mar. 25, 2003

(54) DETECTING ERRATIC RESISTANCE IN TEMPERATURE SENSORS

(75) Inventors: James Van Orchard, II, Holley, NY (US); David Francis Cahill, Rochester, NY (US)

(73) Assignee: NexPress Solutions LLC, Rochester, NY (US)

( * ) Notice: Subject to any disclaimer, the term of this patent is extended or adjusted under 35 U.S.C. 154(b) by 0 days.

(21) Appl. No.: 09/540,789

(22) Filed: Mar. 31, 2000

(51) Int. Cl.[7] ......................... G01R 31/02; G03G 15/20

(52) U.S. Cl. ....................... 324/549; 324/537; 324/612; 399/69

(58) Field of Search ................................ 324/549, 537, 324/612; 399/68, 69

(56) References Cited

U.S. PATENT DOCUMENTS

| | | | | | |
|---|---|---|---|---|---|
| 4,760,574 | A | * | 7/1988 | Budworth et al. | |
| 4,849,701 | A | * | 7/1989 | Saatkamp et al. | 324/549 |
| 4,951,096 | A | * | 8/1990 | Derimiggio et al. | 399/69 |
| 5,079,506 | A | * | 1/1992 | Choi | 324/549 |
| 5,281,793 | A | * | 1/1994 | Gavin et al. | 219/216 |
| 5,404,200 | A | * | 4/1995 | Martin et al. | 399/68 |
| 5,469,463 | A | * | 11/1995 | Polish et al. | 395/182.18 |

* cited by examiner

*Primary Examiner*—Kamand Cuneo
*Assistant Examiner*—Paresh Patel
(74) *Attorney, Agent, or Firm*—Lawrence P. Kessler

(57) ABSTRACT

In a reproduction apparatus having a logic and control unit, and a fuser assembly including a heated fuser roller and a sensor for sensing the temperature of such fuser roller by utilizing heat to change sensor resistance to provide an electrical signal corresponding to the fuser temperature, for the logic and control unit, a method for detecting erratic resistance in the temperature sensor. The method includes the steps of, at preselected time intervals, comparing a current temperature reading to a previous temperature reading, and determining if the temperature sensing system indicates that the temperature has changed by more than a predetermined amount based upon reproduction apparatus operating characteristics. If the temperature sensing system indicates, from the determining step, that the temperature has changed by more than a predetermined amount, an indication that an error has occurred is made. Then, such error indication is recorded in an error log of the logic and control unit, and a response strategy for such error is provided.

7 Claims, 1 Drawing Sheet

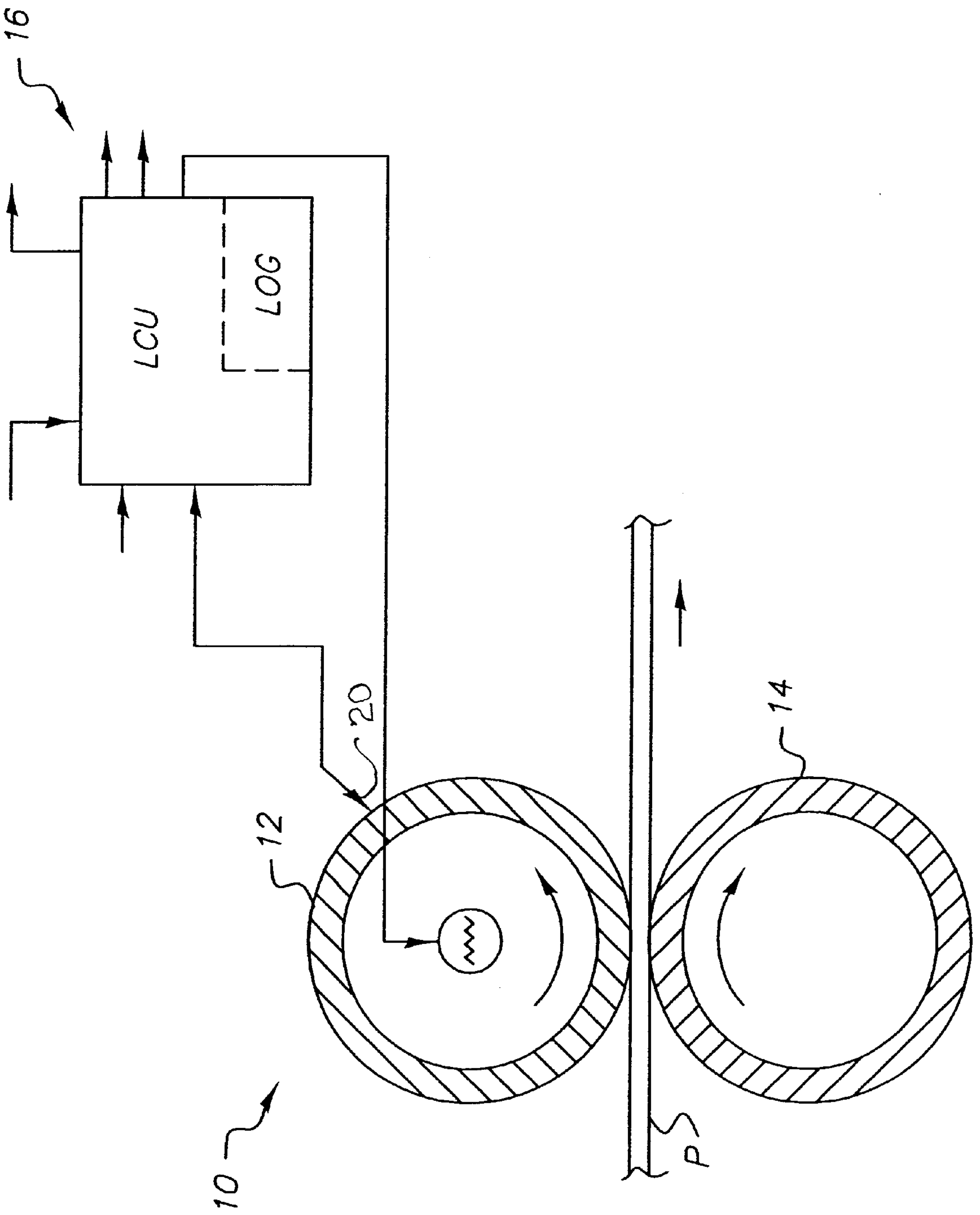
16
LCU
LOG
20
12
14
10
P

DETECTING ERRATIC RESISTANCE IN TEMPERATURE SENSORS

FIELD OF THE INVENTION

This invention relates in general to fuser assemblies for reproduction apparatus, and more particularly to detection of erratic resistance behavior in temperature sensors for a reproduction apparatus fuser assembly.

BACKGROUND OF THE INVENTION

In typical commercial electrographic reproduction apparatus (copier/duplicators, printers, or the like), a latent image charge pattern is formed on a uniformly charged charge-retentive or photoconductive member having dielectric characteristics (hereinafter referred to as the dielectric support member). Pigmented marking particles are attracted to the latent image charge pattern to develop such image on the dielectric support member. A receiver member, such as a sheet of paper, transparency or other medium, is then brought into contact with the dielectric support member, and an electric field applied to transfer the marking particle developed image to the receiver member from the dielectric support member. After transfer, the receiver member bearing the transferred image is transported away from the dielectric support member, and the image is fixed (fused) to the receiver member by heat and pressure to form a permanent reproduction thereon.

One type of fuser assembly, utilized in typical reproduction apparatus, includes at least one heated roller and at least one pressure roller in nip relation with the heated roller. The fuser assembly rollers are rotated to transport a receiver member, bearing a marking particle image, through the nip between the rollers. The pigmented marking particles of the transferred image on the surface of the receiver member soften and become tacky in the heat. Under the pressure, the softened tacky marking particles attach to each other and are partially imbibed into the interstices of the fibers at the surface of the receiver member. Accordingly, upon cooling, the marking particle image is permanently fixed to the receiver member.

Fusing the marking particle image onto a receiver member generally requires a precisely controlled temperature of the surface of the fusing roller. Typical temperatures of 300° F. to 430° F. are used depending on the design of the system and must be held to within +/−10° F. of the set point for optimum results from the particular fuser assembly. If the fuser temperature varies high or low from the set point, many undesirable effects are possible. If the fuser temperature is too low, the marking particles will not be melted sufficiently for proper fixing to the receiver member. This causes poor quality images where portions of the image flake off the receiver during normal handling. In addition, marking particles may adhere to the fuser roller and later flake off randomly on successive receiver members causing black/colored artifacts (spots) on the receiver member. When the buildup of marking particles on the fuser roller becomes too great, the receiver member may stick to the fuser roller and cause a jam. In most cases, this series of events cause the fuser roller and other parts of the fuser assembly to be irreparably damaged to the extent that they must be replaced.

If the fuser temperature is too high, the image will be fixed to the receiver but marking particles may again adhere to the fuser roller, causing poor image quality and jams. Other high fuser temperature effects include, but are not limited to, high internal temperatures inside the enclosure of the machine which may damage temperature sensitive components such as the dielectric support member, high temperatures of customers accessible parts, general shortening of reproduction apparatus part lives, and evoking the function of the back-up temperature safety systems.

Thermistors are typically used as temperature measuring devices for fuser rollers. These thermistors are enclosed in a holder that is positioned near or in contact with the fuser roller. The assembled thermistor and holder are referred to as the temperature sensor. The thermistor is used in an electrical circuit where its resistance causes a proportional voltage output. As the fuser temperature changes, the thermistor resistance and associated circuit voltages change accordingly. Because of the close proximity of the sensor to the heated fuser roller, the sensor is heated to a high temperature. It has, however, been discovered that some sensors fail in an erratic and intermittent manner. The intermittent nature of the failure makes it difficult for service personnel to identify the failure.

SUMMARY OF THE INVENTION

In view of the above, this invention is directed to a method for detecting erratic resistance in the temperature sensor in a reproduction apparatus having a logic and control unit, and a fuser assembly including a heated fuser roller and a sensor for sensing the temperature of such fuser roller by utilizing heat to change sensor resistance to provide an electrical signal corresponding to the fuser temperature, for the logic and control unit. The method includes the steps of, at preselected time intervals, comparing a current temperature reading to a previous temperature reading, and determining if the temperature sensing system indicates that the temperature has changed by more than a predetermined amount based upon reproduction apparatus operating characteristics. If the temperature sensing system indicates, from the determining step, that the temperature has changed by more than a predetermined amount, an indication that an error has occurred is made. Then, such error indication is recorded in an error log of the logic and control unit, and a response strategy for such error is provided.

BRIEF DESCRIPTION OF THE DRAWING

In a detailed description of a preferred embodiment of the invention presented below, reference is made to the accompanying drawing in which:

The FIGURE is a schematic illustration of the fuser assembly of a reproduction apparatus including a temperature sensing system whose erratic resistance is detected in the manner according to this invention.

DETAILED DESCRIPTION OF THE INVENTION

As described above, with fuser assemblies for reproduction apparatus (see, for example, fuser assembly 10 in the accompanying drawing figure), it is common practice to use thermistors (shown schematically as sensor 20) to sense the temperature of the fuser. Thermistors are enclosed in a holder that is positioned near or in contact with the fuser roller. The assembled thermistor and holder, and associated electrical circuitry, are referred to as the temperature sensor system (shown and described in for example U.S. Pat. No. 4,232,959, issued Nov. 11, 1980). The thermistor is used in an electrical circuit where it's resistance causes a proportional voltage output. As the fuser temperature changes, the thermistor resistance and associated circuit voltages change accordingly. The circuit voltages from the thermistors provide input signals for a microprocessor-based logic and control unit (designated in the drawing figure by the numeral 16) for the reproduction apparatus. Based on the thermistor circuit voltage signals, the logic and control unit 16 adjusts the fuser temperature to keep the temperature in the optimum operating range.

As with many electrical components subject to extreme temperatures, after a time the temperature sensors will fail. As noted, some reproduction apparatus fuser temperature sensors fail in an erratic and intermittent manner. That is to say, the thermistor resistance and associated circuit voltages change in a manner such that the temperature change and resistance change do not directly correspond as is the case under proper operating conditions. Such sensors have shown to provide the proper resistance for a period of time but suddenly change resistance for no apparent reason. The resistance typically increases, which under proper operating conditions indicate that the fuser is too cold. When this condition occurs, the fuser temperature control algorithm of the logic and control unit 16 calculates this as a cold condition and raises the heat input into the fuser roller 12. Being an intermittent condition, the resistance typically returns to the normal correct value and the control algorithm responds by lowering the fuser roller temperature.

The described intermittent resistance change condition has been found to be unpredictable. The incorrect resistance for a particular corresponding temperature may last for a few milliseconds or many hours. While the exact cause of this phenomena is not known, it is believed to be related to a failure inside the thermistor bead of the connection of the wires to the semiconductor. The bead is coated with glass and cannot be opened for analysis. It has been determined that during the intermittent resistance change, such resistance changes have been small enough to generally remain below the under and over temperature shutdown set points for the reproduction apparatus fuser assembly. Therefore, the reproduction apparatus continue to operate, but at the wrong fuser temperatures. It should be noted that had the resistance change been enough to exceed the normal set point limits, the problem would have been identified as a temperature problem and the service technician would have been directed to the appropriate area for problem correction.

As a result of the described intermittent resistance change condition, multiple service calls can be initiated for contaminated fuser rollers. During each service call, the fuser temperature would be verified as being within specification. Since nothing would be found wrong at the time, only the fuser rollers would be changed. However, the fuser assembly would later experience repeat failures of the same type. Eventually the service technician would, by a process of elimination, determine that the temperature sensor was in fact faulty and change the sensor. The repeated unresolved problems of the reproduction apparatus can cause both a high degree of customer dissatisfaction and service technician frustration.

It is known that temperature changes of the fuser roller are limited by the surroundings and operating characteristics of the reproduction apparatus fuser assembly. For any particular fuser assembly, the fuser heating lamps are a known wattage, and it can be determined that such lamps can only increase the fuser temperature at a known rate. Additionally, the receiver members can only extract a known quantity of heat from the fuser. Further, the effects of air currents in the area of the fuser can be established. With these described surrounding and operating characteristics, conditions as the limits of expected events relating to fusing an algorithm may be established for the logic and control unit whereby any temperature changes in the reproduction apparatus fuser assembly, beyond those which would be expected by such conditions, can be deemed to be an error in the temperature measuring system.

Thus, according to this invention, changes in the fuser temperature are monitored by the reproduction apparatus logic and control unit 16. For at preselected time intervals (such as every one second), the logic and control unit causes a comparison of the current temperature reading to be made to the previous temperature reading. If the temperature sensing system indicates that the temperature has changed by more than a predetermined amount (such as 10?F), an error is recorded in an error log of the logic and control unit. Different response strategies are then possible with such error monitoring technique. For example, the reproduction apparatus could be stopped after a predetermined number of errors have occurred, or the errors could just be accumulated in the log. If the errors are only accumulated, the service technician would be notified to analyze the cause of such errors at the next service call. Within a service troubleshooting guide, the service technician may be directed to check normal items such as loose connections. If no other problems are found, the service technician can be directed to monitor or replace the temperature sensor.

By their very nature, intermittent electrical problems, similar to the described intermittent resistance change problems of the temperature sensor, are extremely difficult to troubleshoot. This invention could be applied to the analysis of proper functioning of any electrical output where logic and control unit 16 is available and used to control or monitor the electrical circuit. This invention goes beyond typical monitoring of a limit or threshold. This invention utilizes the physics of rates of change to identify unnatural behavior to identify a defective system or component.

The invention has been described in detail with particular reference to certain preferred a embodiment thereof, but it will be understood that variations and modifications can be effected within the spirit and scope of the invention.

What is claimed is:

1. In a reproduction apparatus having a logic and control unit, and a fuser assembly including a heated fuser roller and a temperature sensing system having a resistance type temperature sensor for sensing the temperature of such fuser roller by utilizing heat to change sensor resistance to provide an electrical signal corresponding to the fuser temperature, for the logic and control unit, a method for detecting erratically acting resistance in the resistance type temperature sensor, said method comprising the steps of:

at preselected time intervals, taking temperature sensor readings and comparing one temperature reading to the previous temperature reading;

determining, on the basis of a difference in such compared temperature sensor readings, if the temperature sensing system indicates that the temperature has changed by more than a predetermined amount that would be expected based on known operating characteristics of said fuser assembly;

if the temperature sensing system indicates, from the determining step, that the temperature has changed by more than such predetermined amount, indicating that an error in the resistance of the resistance type temperature sensor has occurred;

recording such error indication in an error log of the logic and control unit; and providing a response strategy for such an error.

2. The method for detecting erratic resistance in the temperature sensor of claim 1, wherein said step of providing a response strategy includes stopping the reproduction apparatus after a predetermined number of errors have occurred.

3. The method for detecting erratic resistance in the temperature sensor of claim 1, wherein when said step of providing a response strategy includes accumulating the error indications in the log, and providing a service technician with notification to analyze the cause of such errors at the next service call.

4. The method for detecting erratic resistance in the temperature sensor of claim 3, wherein when said service technician is provided with notification to analyze the cause of such errors at the next service call, providing said service technician with a service troubleshooting guide where the service technician is directed to check normal items, and if no other problems are found, directed to monitor or replace the temperature sensor.

5. The method for detecting erratic resistance in the temperature sensor of claim 1, wherein said preselected time interval is once every one second.

6. The method for detecting erratic resistance in the temperature sensor of claim 1, wherein said predetermined amount is 10° F.

7. The method for detecting erratic resistance in the temperature sensor of claim 1, wherein said preselected time interval is once every one second, and said predetermined amount is 10° F.

* * * * *